United States Patent
Goto et al.

(10) Patent No.: US 7,404,915 B2
(45) Date of Patent: Jul. 29, 2008

(54) ELECTROMAGNETIC WAVE SHIELDING MATERIAL, METHOD OF MANUFACTURING THE SAME AND ELECTROMAGNETIC WAVE SHIELDING MATERIAL FOR PLASMA DISPLAY PANEL

(75) Inventors: Narito Goto, Sagamihara (JP); Takeshi Habu, Hachioji (JP)

(73) Assignee: Konica Minolta Medical & Graphic, Inc. (JP)

( * ) Notice: Subject to any disclaimer, the term of this patent is extended or adjusted under 35 U.S.C. 154(b) by 0 days.

(21) Appl. No.: 11/636,794

(22) Filed: Dec. 11, 2006

(65) Prior Publication Data

US 2007/0138441 A1    Jun. 21, 2007

(30) Foreign Application Priority Data

Dec. 16, 2005    (JP) .............................. 2005-363141

(51) Int. Cl.
*H01B 1/00*    (2006.01)
*H01B 1/12*    (2006.01)

(52) U.S. Cl. ............... 252/500; 204/192.15; 250/515.1; 250/516.1; 250/517.1; 313/112; 428/209; 428/331; 428/692.1; 428/837; 428/845

(58) Field of Classification Search ................. 252/500, 252/582, 587; 313/112; 428/450, 138, 209, 428/331, 692.1, 837, 845; 204/192.15; 250/515.1, 250/516.1, 517.1
See application file for complete search history.

(56) References Cited

U.S. PATENT DOCUMENTS

| | | | | | |
|---|---|---|---|---|---|
| 5,989,720 | A | * | 11/1999 | Taniyama .................... | 428/450 |
| 6,103,640 | A | * | 8/2000 | Yoshikawa et al. ............ | 442/16 |
| 2004/0214023 | A1 | * | 10/2004 | Park et al. .................... | 428/458 |
| 2006/0083948 | A1 | * | 4/2006 | Kawaguchi et al. ....... | 428/692.1 |
| 2006/0115636 | A1 | * | 6/2006 | Yoshida et al. .............. | 428/209 |
| 2006/0119244 | A1 | * | 6/2006 | Sin et al. .................... | 313/112 |
| 2006/0194020 | A1 | * | 8/2006 | Naito et al. ................. | 428/138 |

FOREIGN PATENT DOCUMENTS

| | | | |
|---|---|---|---|
| JP | 2000-059074 | * | 2/2000 |
| JP | 2000-286594 | * | 10/2000 |
| JP | 2003-005663 | * | 1/2003 |
| JP | 2004-221564 | | 8/2004 |
| JP | 2004-221565 | | 8/2004 |

* cited by examiner

*Primary Examiner*—Mark Kopec
*Assistant Examiner*—Khanh Tuan Nguyen
(74) *Attorney, Agent, or Firm*—Cantor Colburn LLP

(57) ABSTRACT

An objective is to provide an electromagnetic wave shielding material exhibiting an excellent electromagnetic wave shielding property, and also to provide a manufacturing method with quick and simple processing, in which a thin-line-state picture image can easily be formed. An electromagnetic wave shielding material exhibiting an excellent near-infrared shielding property can further be provided if desired. Disclosed is an electromagnetic wave shielding material possessing a support and provided thereon, a conductive metal layer, wherein the conductive metal layer satisfies at least one of the following conditions; (1) a void ratio of the conductive metal layer is 0.1-15%, (2) Glossiness of the conductive metal layer is 50-300%, and (3) Center line average surface roughness (Ra) of the conductive metal layer is 1-50 nm.

15 Claims, No Drawings

ELECTROMAGNETIC WAVE SHIELDING MATERIAL, METHOD OF MANUFACTURING THE SAME AND ELECTROMAGNETIC WAVE SHIELDING MATERIAL FOR PLASMA DISPLAY PANEL

This application claims priority from Japanese Patent Application No. 2005-363141 filed on Dec. 16, 2005, which is incorporated hereinto by reference.

TECHNICAL FIELD

The present invention relates to an electromagnetic wave shielding material exhibiting near-infrared absorbability and visible ray transparency, which is employed for the front surface of plasma display panel (PDP), and to a method for manufacturing the same.

BACKGROUND

In recent years, the need of reducing electromagnetic wave interference (EMI) has heightened due to increasing usage of electronic devices. It has been pointed out that EMI causes malfunctions and failures of electronic and electrical devices, and is also hazardous to humans. For this reason, with respect to electronic devices, it is required that the strength of electromagnetic wave emission is controlled within the range of governmental standards or regulations.

Specifically, plasma display panel (PDP) generates electromagnetic waves in principle because it is based on the principle that rare gases are converted to a plasma state to emit ultraviolet rays stimulating phosphor to emit light. Further, since near-infrared rays are also emitted at this time, resulting in malfunction of operational devices, such as remote controls, so that near-infrared shielding capability as well as electromagnetic wave shielding capability has been desirable. Electromagnetic wave shielding capability is simply represented as a surface resistance value, and in the light-transmitting electromagnetic wave shielding material for a PDP, required is a value of less than 10Ω/sq., and in a consumer plasma television using a PDP, the required value is less than 2 Ω/sq., and the very high conductivity of less than 0.2 Ω/sq. is more desirable.

Further, the desired level of near-infrared ray shielding is at least 60% to be cut off, and preferably at least 80% to be cut off, and still higher shielding capability is expected.

Furthermore, in order to enhance a PDP function, addition of mechanical strength to a PDP body of a thin film of glass, antireflection of sunlight, and color tone correction are desired in addition to near-infrared absorbability.

For this reason, plural transparent base plates are adhered to add mechanical strength, for which employed are combinations of layers, such as a conductive layer for electromagnetic wave shielding, a near-infrared absorption layer for near-infrared shielding, an antireflection layer for antireflection of sunlight, and a layer containing a dye for absorption in a visible light region.

To solve the above problems, specifically to solve the problems of electromagnetic wave shielding and a near-infrared ray, proposed have been methods satisfying both of an electromagnetic wave shielding property utilizing a metal mesh having apertures and a shielding property employing a near-infrared absorption dye. For example, one method is to adhere an infrared absorption film onto a glass plate into the surface of which a metal mesh having a high aperture ratio has been burned. However, in this method, the manufacturing process of burning a metallic mesh is complicated and complex, resulting in problems of a high level of skill in manufacturing and a long processing time.

On the other hand, since the developed silver obtained from silver halide grains is metallic silver, it is possible to produce a mesh of gold or silver depending on the manufacturing method. For example, if a photosensitive material containing silver halide grains is exposed via a mesh and photo-processed, the conductive metallic silver layers in which silver grains gathered in the shape of the mesh can be formed. Since a binder fills the spaces among the silver grains, resulting in interference of conductivity, it is necessary to reduce the binder volume, but conductivity is not sufficiently improved only by it. Therefore, methods employing plating treatment to enhance conductivity are proposed, (please refer to, for example, Patent Documents 1 and 2). However, the manufacturing process of a plating treatment needs to employ a plating solution with the inherent problem of generating harmful effluent containing heavy metals.

(Patent Document 1) Japanese Patent O.P.I. Publication No. 2004-221564

(Patent Document 2) Japanese Patent O.P.I. Publication No. 2004-221565

SUMMARY

As mentioned above, the method utilizing silver halide is complicated due to the need of conducting additional manufacturing processing such as plating treatment, because the function as a conductive line is not sufficient, even if the particle configuration is made smaller or the binder volume is reduced, whereas silver halide is in a form of grain.

The present invention was effected in view of the above situation. An object of the present invention is to provide an electromagnetic wave shielding material which simultaneously exhibits a high electromagnetic wave shielding property, together with a high infrared shielding property and also to provide a method for manufacturing the same with quick and simple processing, in which a thin-line-state picture image is easily formed.

DESCRIPTION OF THE PREFERRED EMBODIMENTS

The above object of the present invention is accomplished by the following structures.

(Structure 1) An electromagnetic wave-shielding material comprising a support and provided thereon, a conductive metal layer, wherein the conductive metal layer satisfies at least one of the following conditions;

(1) a void ratio of the conductive metal layer is 0.1-15%, (2) Glossiness of the conductive metal layer is 50-300%, and (3) Center line average surface roughness (Ra) of the conductive metal layer is 1-50 nm.

(Structure 2) The electromagnetic wave shielding material of Structure 1, wherein the conductive metal layer comprises silver.

(Structure 3) The electromagnetic wave shielding material of Structure 1, further comprising a near-infrared absorption layer provided on the support.

(Structure 4) The electromagnetic wave shielding material of Structure 3, wherein the near-infrared absorption layer is provided between the support and the conductive metal layer, or on a side of the support opposite the conductive metal layer.

(Structure 5) The electromagnetic wave shielding material of Structure 1, wherein the conductive metal layer has a surface resistance of at most 10 Ω/sq.

(Structure 6) The electromagnetic wave shielding material of Structure 1, wherein the conductive metal layer has a surface resistance of at most 2 Ω/sq.

(Structure 7) The electromagnetic wave shielding material of Structure 1, comprising the support and provided thereon a conductive metal mesh having a line width of at most 20 μm, a line space of at least 50 μm, a thickness of at most 20 μm and an aperture ratio of at least 85%.

(Structure 8) A method of manufacturing the electromagnetic wave shielding material of Structure 1, comprising the steps of exposing a silver halide photosensitive material to light, and developing the exposed silver halide photosensitive material via photographic processing.

(Structure 9) The method of manufacturing the electromagnetic wave shielding material of Structure 1, comprising the steps of: exposing a silver halide photosensitive material to light, developing the exposed silver halide photosensitive material via photographic processing; and subsequently conducting an applied pressure treatment to the developed silver halide photosensitive material.

(Structure 10) The method of Structure 9, wherein the applied pressure treatment is a calender treatment conducted at 50-500 kg.

(Structure 11) The method of Structure 8, comprising the steps of exposing the silver halide photosensitive material to light, developing the exposed silver halide photosensitive material via photographic processing, and subsequently conducting at least one of a physical development treatment and a plating treatment to the developed silver halide photosensitive material.

(Structure 12) The method of Structure 9, comprising the steps of exposing a silver halide photosensitive material to light, developing the exposed silver halide photosensitive material via photographic processing, subsequently conducting at least one of a physical development treatment and a plating treatment to the developed silver halide photosensitive material, and conducting the applied pressure treatment to the silver halide photosensitive material.

(Structure 13) The method of Structure 11, further comprising the step of conducting a drying process at a temperature of 53-100° C., after conducting at least one of the physical development treatment and the plating treatment.

(Structure 14) The method of Structure 12, further comprising the step of conducting a drying process at a temperature of 53-100° C., after conducting at least one of the physical development treatment and the plating treatment.

(Structure 15) The electromagnetic wave shielding material of Structure 1, comprising an electromagnetic wave shielding material for a plasma display panel.

While the preferred embodiments of the present invention have been described using specific terms, such description is for illustrative purposes only, and it is to be understood that changes and variations may be made without departing from the spirit or scope of the appended claims.

DETAILED DESCRIPTION OF THE INVENTION

The present invention will now be described in more detail. First, silver, copper, iron, cobalt, nickel and their alloys are provided as metals usable for a conductive metal layer, but silver or copper is preferably employed in view of conductivity, and iron is preferably usable in view of a ferromagnetic property. The most preferable metal usable in the present invention is silver, and utilized can be a metallic silver obtained via an exposure process and photographic processing of silver halide. The silver halide photosensitive material (it is also called a photosensitive material) will be described.

In the present invention, the silver halide emulsion layer may contain a binder and an active agent, as well as silver halide grains.

As silver halide grains employed in this invention, listed are inorganic silver halide grains, such as silver bromide grains and organic silver halide grains, such as silver behenate grains, but it is preferable to employ inorganic silver halide grains, from which it is easy to obtain conductive metallic silver.

Silver halides preferably employed in this invention include ones which mainly contain AgCl, AgBr or AgI. To obtain a highly conductive metallic silver, it is preferable to employ microscopic silver halide grains exhibiting high sensitivity, after which preferably employed is AgBr-based silver halide containing iodine. When the iodine content is raised, it is possible to obtain microscopic silver halide grains exhibiting high sensitivity.

Silver halide grains are converted to metallic silver grains after development. Then, for electricity to flow from grain to grain, contact areas of the grains need to become as large as possible. For that purpose, it is best that grain size is reduced, but small grains easily aggregate into a large mass, and since contact areas decrease conversely, the optimal grain diameter results. As for an average grain size of a silver halide, it is preferably 1-1,000 nm (being 1 μm) in a spherical equivalent diameter, more preferably 1-100 nm, but still more preferably 1-50 nm. The spherical equivalent diameter of a silver halide grain means diameter of the sphere having an equivalent volume as the silver halide grain.

The shapes of silver halide grains are not specifically limited, and may be various shapes, such as spherical, cubic, tabular (hexagonal tabular, triangular tabular, square tabular), octahedral, or tetradecahedral shapes. In order to dramatically raise sensitivity, tabular grains exhibiting an aspect ratio of 2 or more, 4 or more, and further 8 or more and 16 or less, are preferably employed. The grain size distribution may be broad or narrow, but a narrower distribution is preferable to obtain high conductivity and a large aperture ratio. The degree of monodispersion as known in the photographic industry is preferably 100 or less, but more preferably 30 or less. From the viewpoint of enabling high electrical flow, the contact area among the formed grains is preferable as large as possible. Therefore, the shape of the grains is preferably tabular and exhibiting a large aspect ratio. However, since it is difficult to obtain high image density employing grains of a high aspect ratio, an optimum aspect ratio exists.

Silver halide employed in this invention may further contain other elements. For example, in a photographic emulsion, it is also useful to dope the metal ion to obtain a higher contrast emulsion. Specifically, transition metal ions, such as a rhodium ion, a ruthenium ion, and an iridium ion, are preferably employed, since it becomes easier to effect a difference of the exposed portions and the unexposed portions during formation of the metallic silver images. The transition metal ion represented by a rhodium ion and the iridium ion may also be a compound which has various ligands. As such a ligand, listed are a cyanide ion, a halogen ion, a thiocyanate ion, a nitrosyl ion, water, or a hydroxide ion. As an example of specific compounds, listed are potassium brominated rhodium acid, and potassium iridium acid.

In this invention, the content of the rhodium compound and/or iridium compound contained in a silver halide is preferably $10^{-10}$-$10^{-2}$ mol/molAg, but more preferably $10^{-9}$-$10^{-3}$ mol/molAg, based on the molar number of silver in the silver halide.

In addition, in this invention, preferably employed may be a silver halide containing Pd ions, Pt ions, Pd metal, and/or Pt metal may also be employed. Pd or Pt may be uniformly distributed in silver halide grains, but it is preferable that Pd or Pt is contained near the surface layer of the grains.

In this invention, the content of Pd ion and/or Pd metal contained in the silver halide is preferably $10^{-6}$-0.1 mol/molAg based on the molar number of silver in the silver halide, and more preferably 0.01-0.3 mol/molAg.

Further, in this invention, the silver halide may be subjected to chemical sensitization to increase sensitivity as being conducted for a photographic emulsion. As chemical sensitization, for example, employed is noble metal sensitization, such as gold, palladium, and platinum sensitization; chalcogen sensitization, such as sulfur sensitization using inorganic sulfur or an organic sulfur compound; or reduction sensitization using tin chloride or hydrazine.

It is preferable that the chemically sensitized silver halide grains are further subjected to spectral sensitization. As preferable spectral sensitizing dyes, listed are cyanine, carbocyanine, dicarbocyanine, complex cyanine, hemicyanine, a styril dye, merocyanine, complex merocyanine, and a holopolar dye. These spectral sensitizing dyes, usually employed in the photographic industry, may be used singly or in combinations.

Specifically useful dyes are a cyanine dye, a merocyanine dye, and a complex merocyanine dye. In these dyes, any nucleus usually contained in a cyanine dye may serve to form a basic heterocyclic ring nucleus. Namely, those are a pyrroline nucleus, an oxazoline nucleus, a thiazoline nucleus, a pyrrole nucleus, an oxazole nucleus, a thiazole nucleus, a selenazole nucleus, an imidazole nucleus, a tetrazole nucleus, a pyridine nucleus, and nuclei which are formed by coalescence of these nuclei with alicyclic hydrocarbon rings; as well as nuclei which are formed by coalescence of those nuclei with aromatic hydrocarbon rings, that is, an indolenine nucleus, a benzindolenine nucleus, an indole nucleus, a benzoxazole nucleus, a naphthoxazole nucleus, a benzothiazole nucleus, a naphth thiazole nucleus, a benzselenazole nucleus, a benzimidazole nucleus, and a quinoline nucleus. These nuclei may be substituted on a carbon atom.

In a merocyanine dye or complex merocyanine dye, as a nucleus which features a ketomethylene structure, applicable are 5-6 membered heterocyclic ring nuclei, such as a pyrazoline-5-one nucleus, a thiohydantoin nucleus, a 2-thio-oxazolidine-2, a 4-dion nucleus, a thiazolidine-2, a 4-dione nucleus, a rhodanine nucleus, and a thiobarbituric acid nucleus. Specifically preferable sensitizing dye is a near-infrared sensitizing dye. These dyes are based on Japanese Patent O.P.I. Publication Nos. 2000-347343, 2004-037711, and 2005-134710, preferable example of which are shown below.

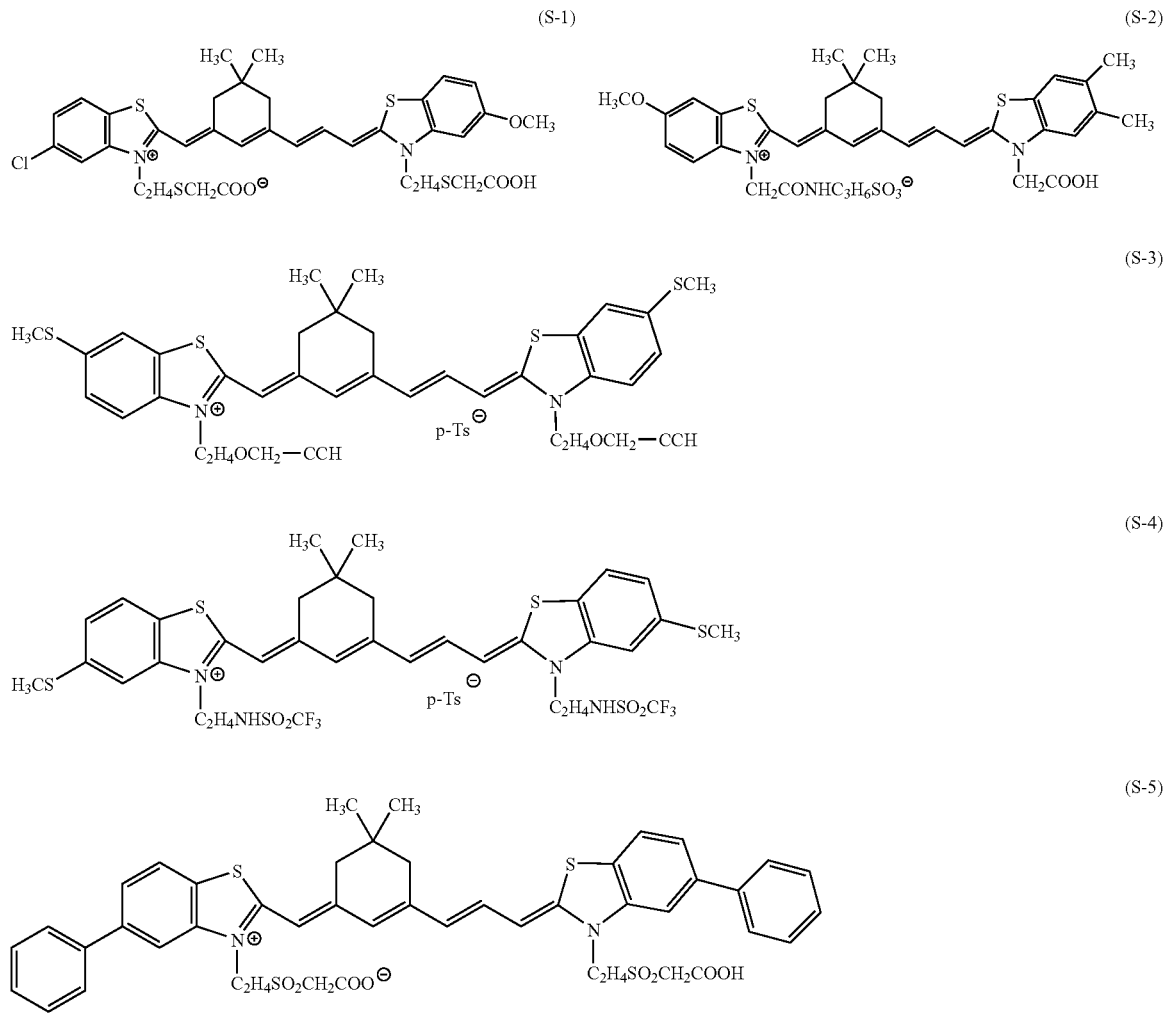

-continued

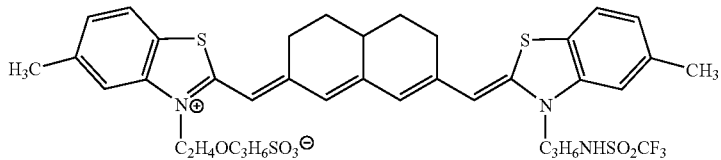
(S-6)

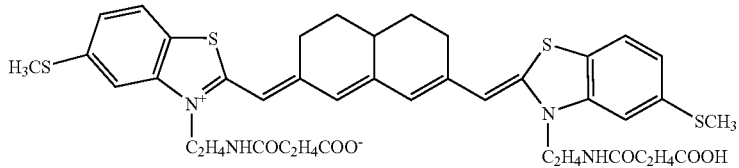
(S-7)

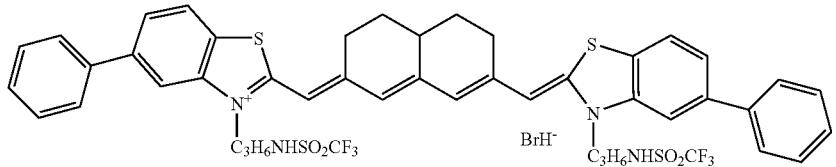
(S-8)

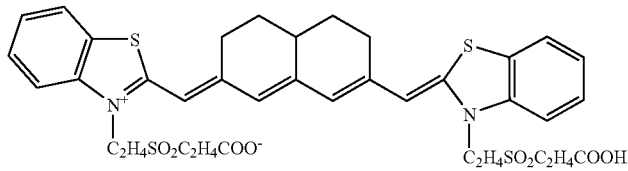
(S-9)

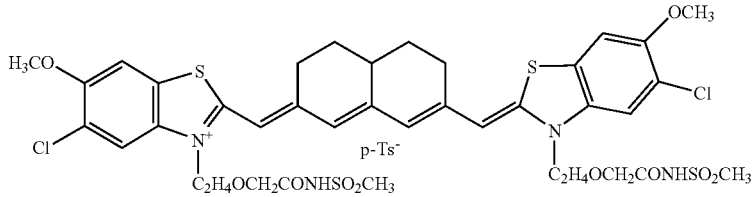
(S-10)

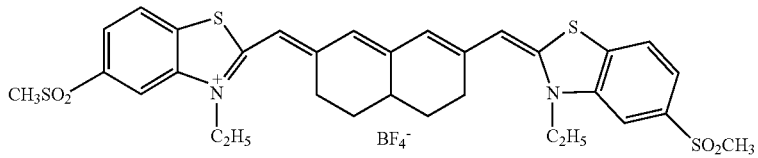
(S-11)

These sensitizing dyes may be employed alone or in combinations. Specifically, combinations of sensitizing dyes are often employed to achieve supersensitization.

To incorporate these sensitizing dyes in a silver halide emulsion, they may be directly dispersed in the emulsion, or may be added after being dissolved in a single or mixed solvent, such as water, methanol, propanol, methyl cellosolve, or 2, 2, 3, 3-tetra-fluoro propanol. Further, the dyes may be added as an aqueous solution under coexistence of an acid or a base, as described in Examined Japanese Patent Publication Nos. (hereinafter, referred to as JP-B) 44-23389, 44-27555, and 57-22089, or they may be added to the emulsion after having been dissolved as an aqueous solution or colloidal dispersion employing a surfactant, such as sodium dodecylbenzenesulfonate, as described in U.S. Pat. Nos. 3,822,135, and 4,006,025. Further, the dyes may be added to the emulsion, after having been dissolved in a basically water immiscible solvent, such as phenoxyethanol as well as being dispersed in water or a hydrophilic colloidal. Also, the dyes may be added to the emulsion as a dispersion in which the dyes are directly dispersed into a hydrophilic colloid, as described in Japanese Patent O.P.I. Publication Nos. 53-102733 and 58-105141.

As a contrast-increasing method of the silver halide grains, may be a method to raise the silver chloride content and to decrease the distribution range of grain diameter. In the printing plate field, to drastically raise the contrast, known is employment of a hydrazine compound and a tetrazolium compound as a contrast-increasing agent. A hydrazine compound is a compound which has an —NHNH— group, typical examples of which will be shown in the following formulas.

T-NHNHCO—V, T-NHNHCOCO—V

In the above formulas, T is an aryl group or a hetero ring group, each of which may be substituted. The aryl group represented by T contains a benzene or naphthalene ring, which rings may have a substituent, and preferable examples of the substituents include a straight or blanched alkyl group (being preferably a methyl group, an ethyl group, an isopropyl group, or an N-dodecyl group, having 2-20 carbon atoms); an alkoxy group (being preferably a methoxy group, or an ethoxy group, having 2-21 carbon atoms); an aliphatic acylamino group (being preferably an acetylamino group, or a heptylamino group, having an alkyl group of 2-21 carbon atoms); and an aromatic acylamino group. In addition to these groups, are for example, groups in which the above substituted or unsubstituted aromatic rings are linked with a linkage group, such as —CONH—, —O—, —SO$_2$NH—, —NHCONH—, or —CH$_2$CHN—. V is a hydrogen atom, an alkyl group (e.g., a methyl group, an ethyl group, a butyl group, or a trifluoro methyl group); an aryl group (e.g., a phenyl group, or a naphthyl-group); or a heterocyclic group (e.g., a pyridyl group, the piperidyl group, a pyrrolidyl group, a furanyl group, a thiophene group, and a pyrrole group); all of which groups may be substituted.

Hydrazine compounds may be synthesized based on methods described in U.S. Pat. No. 4,269,929, and may be incorporated in the emulsion layer, an hydrophilic colloid layer adjacent to the emulsion layer, or other hydrophilic colloid layers.

Specifically preferable hydrazine compounds are listed below.
(H-1): 1-trifluoromethylcarbonyl-2-{[4-(3-n-butylureido)phenyl]}hydrazine
(H-2): 1-trifluoromethylcarbonyl-2-{4-[2-(2,4-di-tert-pentylpPhenoxy)butylamide]phenyl}hydrazine
(H-3): 1-(2,2,6,6-tetramethylpiperidyl-4-amino-oxazaryl)-2-{4-[2-(2,4-di-tert-pentylphenoxy)butylamide]phenylsulphoneamidephenyl}hydrazine
(H-4): 1-(2,2,6,6-tetramethylpiperidyl-4-amino-oxalyl)-2-{4-[2-(2,4-di-tert-pentylphenoxy)butylamide]phenylsulfonamidephenyl}hydrazine
(H-5): 1-(2,2,6,-tetramethylpiperidyl-4-amino-oxalyl)-2-{4-[3-(4-chlorophenyl-4-phenyl-3-thia-butaneamide)benzenesulfonamide]phenyl}hydrazine
(H-6): 1-(2,2,6,6-tetramethylpiperidyl-4-amino-oxalyl)-2-[4-(3-thia-6,9,12,15-tetraoxatricosaneamide)benzenesulphoneamide]phenylhydrazine
(H-7): 1-(1-methylenecarbonylpyridinium)-2-[4-(3-thia-6,9,12,15-tetra-oxatricosaneamide)benzenesulfonamide]phenylhydrazine chloride Specifically preferable hydrazine compounds are ones in which the T group is substituted with a sulphoneamidephenyl group and which V group is substituted with a trifluoromethyl group. Further, the oxalyl group linked to the hydrazine is specifically preferably a pypelydylamino group which may be substituted.

Examples of a tetrazolium compounds are shown below.
(T-1): 2,3-di(p-methylphenyl)-5-phenyltetrazolium chloride
(T-2): 2,3-di(p-ethylPhenyl)-5-phenyltetrazolium chloride
(T-3): 2,3,5-tri-p-methylphenyltetrazolium chloride
(T-4): 2,3-diphenyl-5-(P-methoxyphenyl)tetrazolium chloride
(T-5): 2,3-di(O-methylphenyl)-5-phenyltetrazolium chloride
(T-6): 2,3,5-tri-p-methoxyphenyltetrazolium chloride
(T-7): 2,3-di(O-methylphenyl)-5-phenyltetrazolium chloride
(T-8): 2,3-di(m-methylphenyl)-5-Phenyltetrazolium chloride
(T-9): 2,3,5-tri-p-ethoxymethylphenyltetrazolium chloride These may be employed, based on the description in Japanese Patent Examined Publication No. 5-58175, and in some cases, may be employed in combinations with hydrazine compounds.

When employing a hydrazine as a contrast-increasing agent, an amine compound or a pyridine compound may be employed to strengthen the reduction action of hydrazine. A typical amine compound may be represented by the following formula, which contains at least one nitrogen atom.

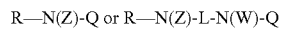

R—N(Z)-Q or R—N(Z)-L-N(W)-Q

In the above formula, R, Q, Z, and W are an alkyl group of 2-30 carbon atoms which may be substituted. Further, these alkyl group chains may be linked with a hetero atom, such as nitrogen, sulfur, and oxygen. R and Z, or Q and W, may mutually form a saturated or unsaturated ring. L is a divalent linkage group, which may contain a heteroatom, such as sulfur, oxygen, or nitrogen. Carbon atoms from 1-200 in the linkage group are possible, and sulfur atoms may be 1-30, nitrogen atoms may be 1-20, and oxygen atoms may be 1-40, but these are not meant to be limited. Specific examples of these amine compounds follow.
(A-1): diethylamino ethanol
(A-2): dimethylamino-1
(A-3): 2-propanediol
(A-4): 5-amino-1-pentanol
(A-5): diethylamine
(A-6): methylamine
(A-7): triethylamine
(A-8): dipropylamine
(A-9): 3-dimethylamino-1-propanol
(A-10): 1-dimethylamino-2-propanol
(A-11): bis(dimethylaminotetraethoxy)thioether
(A-12): bis(diethylaminopentaethoxy)thioether
(A-13): bis(piperidinotetraethoxy)thioether
(A-14): bis(piperidinoethoxyethyl)thioether
(A-15): bis(nipecotinediethoxy)thioether
(A-16): bis(dicyanoethylaminodiethoxy)ether
(A-17): bis(diethoxyethylaminotetraethoxy)ether
(A-18): 5-dibutylaminoethylcarbamoyl benzotriazole
(A-19): 5-morpholinoethylcarbamoyl benzotriazole
(A-20): 5-(2-methylimidazole-2-ethylene)carbamoyl benzotriazole
(A-21): 5-dimethylaminoethylureylene benzotriazole
(A-22): 5-diethylaminoethylureylene benzotriazole
(A-23): 1-diethylamino-2-(6-aminopurine)ethane
(A-24): 1-(dimethylaminoethyl)-5-mercaptotetrazole
(A-25): 1-piperidinoethyl-5-mercaptotetrazole
(A-26): 1-dimethylamino-5-mercaptotetrazole
(A-27): 2-mercapto-5-dimethylaminoethylthio thiadiazole
(A-28): 1-mercapto-2-morpholinoethane As an amine compound, specifically preferred is one which containsin the molecule at least one piperidine ring or a pyrrolidine ring, at least one thioether linkage, and at least two ether linkages.

A pyridinium compound or a phosphonium compound may be employed other than an amine compound as a compound to strengthen the reduction action of hydrazine. It is assumed that since an onium compound is tinged with a positive charge, it adsorbs onto the negatively charged silver halide grain, which enhances contrast by promoting electron injection from the developing agents during development.

Preferable pyridinium compounds are listed in the bis-pyridinium compounds of Japanese Patent O.P.I. Publication Nos. 5-53231 and 6-242534. Specifically preferable pyridinium compounds are ones having a bis-pyridinium form by linkage at the 1- and 4-position of pyridinium. As a salt form, preferably listed are a halogen anion, such as a chlorine ion and a bromine ion, as well as a boron tetrafluoride ion and a perchlorate ion, of which the chlorine ion and boron tetrafluorate ion are more preferable. Examples of preferable bis-pyridinium compounds follow.

(P-1): 1,1'-dimethyl-4,4'-bipyridinium dichloride
(P-2): 1,1'-dibenzyl-4,4'-bipyridinium dichloride
(P-3): 1,1'-diheptyl-4,4'-bipyridinium dichloride
(P-4): 1,1'-di-n-octyl-4,4'-dipyridium dichloride
(P-5): 4,4'-dimethyl-1,1'-bipyridinium dichloride
(P-6): 4,4'-dibenzyl-1,1'-bipyridinium dichloride
(P-7): 4,4'-diheptyl-1,1'-bipyridinium dichloride
(P-8): 4,4'-di-n-octyl-1,1'-bipyridinium dichloride
(P-9): bis(4,4'-diacetoamide-1,1'-tetramethylene bipyridinium)dichloride Although a hydrazine compound acts to increase contrast in high density areas, the contrast-increase in the toe portion is not sufficient, so that, the technique of utilizing the developing agent oxidant generated during development is considered as a means to decrease this drawback. A redox compound which reacts with the developing agent oxidant is incorporated to release an inhibitor which works to restrain development in the toe portion of the image, resulting in enhanced sharpness of the image. Since the developing agent oxidant is generated based on the progress of development, generation of the oxidant relates to the reduction rate of grains. Since this effect can be enhanced in cases when the developing nuclei exhibiting a high speed reduction rate are formed by a chemical sensitizing agent, suitable chemical sensitizing agents are desired. If the compound of the present invention is employed, marked by high effects can be obtained when using a redox compound.

A redox compound incorporates a redox group, from such as hydroquinones, catechols, naphthohydroquinones, aminophenol, pyrazolidones, hydrazines, and reductones. Preferable redox compounds include compounds which have an —NHNH-group as a redox group, typical componds of which are represented by the following formulas.

T-NHNHCO—V-(Time)$_n$-PUG

T-NHNHCOCO—V-(Time)$_n$-PUG

In the above formulas, T and V are such groups identical to the above hydrazine compound. PUG is a photographically beneficial group, listed examples of which are 5-nitroindazole, 4-nitroindazole, 1-phenyltetrazole, 1-(3-sulfophenyl)tetrazole, 5-nitrobenztriazole, 4-nitrobenztriazole, 5-nitroimidazole, and 4-nitroimidazole. These development restraining groups may be directly linked to a CO site of T-NHNH—CO— via a hetero atom, such as N and S, or linked to the CO site via an alkylene, a phenylene, an alalkylene, an aralkylene, or an aryl group which are represented by (Time), further via hetero atoms, such as N and S. In addition, employed may be the compounds incorporating a development restraining group, such as triazole, indazole, imidazole, thiazole, and thiadiazole, into the hydroquinone compound having a ballast group. Listed are, for example, 2-(dodecylethyleneoxide) thiopropionic acid amide-5-(5-nitroindazole-2-yl)hydroquinone, 2-(stearylamide)-5-(1-phenyltetrazole-5-thio)hydroquinone, 2-(2,4-di-t-amylphenylpropionic acid amide)-5-(5-nitrotriazole-2-yl)hydroquinone, and 2-dodecylthio-5-(2-mercaptothiothiadiazole-5-thio)hydroquinone, in which n is 1 or 0. The redox compounds may be synthesized based on the descriptions in U.S. Pat. No. 4,269,929. Specifically preferable redox compounds are listed below.

(R-1): 1-(4-nitroindazole-2-yl-carbonyl)-2-{[4-(3-n-butylureido)phenyl]}hydrazine
(R-2): 1-(5-nitroindazole-2-yl-carbonyl)-2-{4-[2-(2,4-di-tertpentylphenoxy)butylamide]phenyl}hydrazine
(R-3): 1-(4-nitrotriazole-2-yl-carbonyl)-2-{4-[2-(2,4-di-tert-pentylphenoxy)butylamide]phenyl}hydrazine
(R-4): 1-(4-nitroimidazole-2-yl-carbonyl)-2-{4-[2-(2,4-di-tert-pentylphenoxy)butylamide]phenylsulfonamidephenyl}hydrazine
(R-5): 1-(1-sulfophenyltetrazole-4-methyloxazole)-2-[3-(1-phenyl-1'-p-clorophenylmethane thioglycineamidephenyl)sulfonamidephenyl]hydrazine
(R-6): 1-(4-nitroindazole-2-yl-carbonyl)-2-{[4-(octyl-tetraethyleneoxide)-thio-glycineamidephenyl-sulfonamidephenl]}hydrazine A hydrazine compound, an amine compound, a pyridinium compound, a tetrazolium compound, and a redox compound are preferably incorporated at $1\times10^{-6}$-$5\times10^{-2}$ mol per mol of silver halide, and but preferably at $1\times10^{-4}$-$2\times10^{-2}$ mol. It is easy to adjust contrast-increasing degree γ when it is more than 6 by control of the added amount of these compounds. Symbol γ may further be adjusted by control of monodispersibility of the emulsion, the added amount of rhodium, and chemical sensitization. Herein, γ is the density difference over the difference of each exposure amount at densities of 0.1 and 3.0.

These compounds are employed by addition to the silver halide emulsion layers or other hydrophilic colloid layers of a photosensitive material. They may be added to the silver halide emulsion or a hydrophilic colloid solution, in the form of an aqueous solution when they are water soluble, or in the form of a solution of a water-miscible organic solvent, such as alcohols, esters, and ketones when they are water insoluble. Further, in cases when they are not soluble in these organic solvents, it is possible to add these compounds into the emulsion by changing them into micro-particles of 0.01-10.0 μm employing a ball mill, a sand mill, or a jet mill. Micro-particle dispersion is preferably applied with the method of solid dispersion of the dye, which serves as a photographic emulsion additive.

A near-infrared absorption layer can be applied onto the photosensitive material. Usually, it is common to provide layers such as an adhesive layer/an antistatic layer/a near-infrared dye containing layer/and a protective layer on a support. After applying a vinylidene chloride copolymer or a styrene-glycidyl acrylate copolymer of 0.1-1.0 μm as an adhesive layer on the support which is subjected to corona discharge, to serve as an antistatic layer may be a gelatin layer, an acrylic or a methacrylic polymer layer, or a non-acrylic polymer layer, which contains micro-particles of tin oxide or vanadium pentoxide exhibiting an average grain diameter of 0.01-1.0 μm into which indium and/or phosphorus are doped. Further, applied may be a layer formed of a copolymer of styrenesulfonic acid and maleic acid with the above-mentioned aziridine or a carbonyl activated cross-linking agent. A dye layer is applied onto these antistatic layers to serve as a near-infrared absorption layer. In that near-infrared absorption layer, incorporated may be colloidal silica; complex colloidal silica which is produced by coating onto a colloidal silica surface, with a methacrylate or acrylate polymer, or a non-acrylate polymer, such as styrene polymer and acrylamide; an inorganic or complex filler for dimensional stability; a matting agent, such as silica or methyl methacrylate to prevent adhesion; a silicone slipping agent for conveyance control; and a releasing agent. As a dye for a backing layer, employed may be a benzylidene dye or an oxonol dye. These alkali soluble or alkali degradable dyes may be fixed by forming them as micro-particles. Density for antihalation is preferably 0.1-2.0 at each photosensitive wavelength.

The antistatic agent employed in the near-infrared absorption layer may also be employed on the emulsion layer side, and it may be incorporated in a protective layer of the upper layer of the emulsion layer; or either layer or both layers of the protective layer, when the protective layer features two layers; an antihalation layer as a lower layer of the emulsion layer; an inhibiter releasing layer; or a timing layer.

A photosensitive material can be dried by applying the drying theories in chemical engineering. A humidity providing method during drying is appropriately chosen, since it depends on characteristics of the photosensitive material. Quick drying often deteriorates the desired characteristics of the photosensitive material, resulting in such as high fogging or poor storage stability. The silver halide photosensitive material of this invention is preferably dried between 30-90° C., and at a relative humidity of at most 20% for 10-120 seconds, but more preferably between 35-50° C. for 30-50 seconds. Specifically, regarding set up of temperature and humidity, it is desirable to control constant rate drying and falling rate drying. Constant rate drying is a process in which drying is performed as water vaporizes from the film surface, and in this process, the surface temperature is kept constant, and is thus called constant rate drying. In the next process, drying is performed as water vaporizes from the interior of the film, and the wet-bulb temperature approaches that of the film surface temperature, that is, the dry-bulb temperature, both of which finally become the same temperature. This process is thus known as falling rate drying. In drying of the gelatin film, the boundary of constant rate drying and falling rate drying is a point where the contained water is at a factor of 300-400 times the gelatin weight. A drying condition of the water content being a factor of less than 300 times has important significance in the drying condition of the falling rate drying duration. Since productivity increases due to drying at a high temperature as well as a low humidity in the falling rate drying duration, desired is a photosensitive material exhibiting minimal fluctuation of the desired photographic characteristics, or no deterioration of the desired characteristics under these conditions.

Core-set curl of the support is decreased by application of a heat treatment after coating, and resulting in drying of the photosensitive material. To decrease the core-set curl, the heat treatment is conducted between 30-90° C. for 1-240 hours. Specifically preferred is 35-50° C. for 60-120 hours.

Malfunction of electronic devices by near-infrared rays can be prevented by providing a near-infrared absorption dye layer between the emulsion layer and the support, or on the side of the support opposite the emulsion layer.

As specific examples of near-infrared absorption agents, listed are compounds of a polymethine system, a phthalocyanine system, a naphthalocyanine system, a metal complex system, an aminium system, an imonium system, a diimonium system, an anthraquinone system, a dithiol metal complex system, a naphthoquinone system, an indophenol system, an azo system, and a triarylmethane system. In an optical filter for PDP, requirement of capability of near-infrared absorption is mainly due to heat ray absorption and noise prevention of electronic devices. Therefore, preferred are dyes which exhibit near-infrared absorption capability and a maximum absorption wavelength of 750-1100 nm, and specifically preferable are compounds of a metal complex system, an aminium system, a phthalocyanine system, a naphthalocyanine system, and a diimonium system.

The absorption maximum of the conventionally known nickel dithiol complex system compound or a fluorinated phthalocyanine system compound is 700-900 nm, and put into practical use, usually, an effective near-infrared absorption effect can be obtained by employing them in combination with the aminium system compound, especially a diimonium system compound exhibiting the absorption maximum in a longer wavelength region than the above compound. (Please also refer to Japanese Patent O.P.I. Publication Nos. 10-283939, 11-73115, and 11-231106.) In addition, bis(1-thio-2-phenolate) nickel-tetrabutyl onium salt complex of Japanese Patent O.P.I. Publication No. 9-230931, bis(1-thio-2-naphthlate) nickel-tetrabutyl ammonium salt complex of Japanese Patent O.P.I. Publication No. 10-307540 may be cited.

Examples of specific compounds of diimonium system compounds are shown below.

(IR-1): N,N,N',N'-tetrakis(4-di-n-butylaminophenyl)-1,4-benzoquinone-bis(imonium-hexafluoroantimonic acid),
(IR-2): N,N,N',N'-tetrakis(4-di-n-butylaminophenyl)-1,4-benzoquinone-bis(imonium-perchloric acid),
(IR-3): N,N,N',N'-tetrakis(4-di-amylaminophenyl)-1,4-benzoquinone-bis(imonium-hexafluoroantimonic acid),
(IR-4): N,N,N',N'-tetrakis(4-di-n-propylaminophenyl)-1,4-benzoquinone-bis(imonium-hexafluoroantimonic acid),
(IR-5): N,N,N',N'-tetrakis(4-di-n-hexylaminophenyl)-1,4-benzoquinone-bis(imonium-hexafluoroantimonic acid),
(IR-6): N,N,N',N'-tetrakis(4-di-iso-propylaminophenyl)-1,4-benzoquinone-bis(imonium-hexafluoroantimonic acid),
(IR-7): N,N,N',N'-tetrakis(4-di-n-pentylaminophenyl)-1,4-benzoquinone-bis(imonium-hexafluoroantimonic acid),
(IR-8): N,N,N',N'-tetrakis(4-di-methylaminophenyl)-1,4-benzoquinone-bis(imonium-hexafluoroantimonic acid), In addition, when a dye exhibiting near-infrared absorption capability is incorporated in an image tone correction layer, any one of the above dyes may be incorporated alone, but two or more kinds may also be incorporated. To avoid aging deterioration of the near-infrared absorption dye, it is preferable to employ an ultraviolet absorption dye.

As a UV absorbing agent, a well-known UV absorbing agent, for example, a salicylic acid system compound, a benzophenone system compound, a benzotriazole system compound, an S-triazine system compound, or a cyclic imino ester system compound may be employed preferably. Of these, preferable are a benzophenone system compound, a benzotriazole system compound, and a cyclic imino ester system compound. As to what is blended into the polyester, specifically preferable is a cyclic imino ester system compound.

Specifically, preferable examples thereof include:
(UV-1): 2-(2-hydroxy-3,5-di-□-cumyl)-2H-benzotriazole
(UV-2): 5-chloro-2-(2-hydroxy-3-tert-butyl-5-methylphenyl)-2H-benzotriazole
(UV-3): 5-chloro-2-(2-hydroxy-3,5-di-tert-butylphenyl)-2H-benzotriazole
(UV-4): 5-chloro-2-(2-hydroxy-3,5-di-□-cumylphenyl)-2H-benzotriazole
(UV-5): 5-chloro-2-(2-hydroxy-3-□-cumyl-5-tert-octylphenyl)-2H-benzotriazole
(UV-6): 2-[3-tert-butyl-2-hydroxy-5-(2-isooctyloxycarbonylethyl)phenyl]-5-chloro-2H-benzotriazole
(UV-7): 5-trifluoromethyl-2-(2-hydroxy-3-□-cumyl-5-tert-octylphenyl)-2H-benzotriazole
(UV-8): 5-trifluoromethyl-2-(2-hydroxy-5-tert-octylphenyl)-2H-benzotriazole
(UV-9): 5-trifluoromethyl-2-(2-hydroxy-3,5-di-tert-octylphenyl)-2H-benzotriazole
(UV-10): 3-methyl(5-trifluoromethyl-2H-benzotriazole-2-yl)-5-tert-butyl-4-hydroxyhydrocinnamate
(UV-11): 5-butylsulfonyl-2-(2-hydroxy-3-□-cumyl-5-tert-octylphenyl)-2H-benzotriazole
(UV-12): 5-trifluoromethyl-2-(2-hydroxy-3-□-cumyl-5-tert-butylphenyl)-2H-benzotriazole
(UV-13): 2,4-bis(4-biphenylyl)-6-(2-hydroxy-4-octyloxycarbonylethylideneoxyphenyl)-s-triazine (UV-14): 2,4-bis(2,4-dimethylphenyl)-6-[2-hydroxy-4-(3-nonyloxy*-2-hydroxypropyloxy)-5-☐-cumylphenyl]-s-triazine (*: mixture of an octyloxy group, a nonyloxy group and a decyloxy group)
(UV-15): 2,4,6-tris(2-hydroxy-4-isooctyloxycarbonylisopropylideneoxyphenyl)-s-triazine
(UV-16): hydroxyphenyl-2H-benzotriazole
(UV-17): 2-(2-hydroxy-5-methylphenyl)-2H-benzotriazole
(UV-18): 2-(3,5-di-tert-butyl-2-hydroxyphenyl)-2H-benzotriazole The above dyes are preferably fixed in the dye layer as 0.01-10.0 μm micro-particles employing an atomizing machine, to be mentioned later, and the added amount is one which preferably attain an optical density in the range of 0.05-3.0 at the maximum wavelength.

In the silver halide grain containing layer of the present invention, a binder may be employed to uniformly disperse the silver halide grains and also to enhance adhesion between the silver halide grain containing layer and the support. In the present invention, either a non-water soluble polymer or a water soluble polymer may be employed as a binder, but preferable is a water-soluble polymer.

Listed as a binder, for example, may be gelatin, polyvinyl alcohol (PVA) and its derivatives; polyvinyl pyrrolidone (PVP); polysaccharides, such as starch, cellulose and its derivatives; polyethylene oxide; polyvinyl amine; and polyacrylic acid. These compounds exhibit a neutral, anionic or cationic nature, by ionicity of the functional group.

The content of the binder contained in the silver halide grain containing layer of the present invention is not specifically limited, but may be determined in the range of exhibiting dispersibility and adhesion property, as suitable.

The content of the binder in the silver halide grain containing layer is preferably 0.2-100 in the weight ratio of Ag/binder, is more preferably 0.3-30 in view of coated layer strength of the silver halide grain containing layer, though it is preferred that the weight ratio of Ag/binder is large in view of increased conductivity, and is still more preferably 0.5-15. In cases when Ag is incorporated at 0.5 or more compared to the binder of the weight ratio in the silver halide grain containing layer, it is possible to attain higher electrical conductivity since metallic particles tend to contact each other more readily following heat-pressing treatment, which is preferable.

In the present invention, a plastic film, a plastic plate, or a glass plate may be employed as a support. Examples of raw materials of a plastic film and a plastic plate include, for example, polyesters, such as a polyethylene terephthalate (PET) and polyethylenenaphthalate (PEN); vinyl resin, such as polyethylene (PE), polypropylen (PP), and polystyrene; polycarbonate (PC); and triacetyl cellulose (TAC).

From the viewpoint of transparency, heat resistance, ease of handling, and cost, the above plastic film is preferably PET, PEN, or TAC.

In the electromagnetic wave shielding material for a display, high transparency is essential, so high transparency of the support is preferable. In this case, the total visible light transmittance of the plastic film or plastic plate is preferably at least 85%, more preferably at least 88%, and still more preferably at least 90%. Further, in the present invention, employed may be the above plastic film or the plastic plate colored with a tint adjusting agent, but must not impede the targeted objects of this invention.

Solvents employed for preparation of the coating solutions for the silver halide emulsion layer of this invention are not specifically limited, but cited may be water, organic solvents (for example, alcohols such as methanol and ethanol; ketones, such as acetone, methyl ethyl ketone, and methyl isobutyl ketone; amides, such as formamide; sulfoxide, such as dimethyl sulfoxide; esters, such as ethyl acetate; and ethers), ionic liquids, and mixed solvents of these.

The content of the solvent employed in the silver halide emulsion layer of this invention is preferably in the range of 30-90% by weight compared to the total weight of the silver halide grains along with the binder contained in the above silver containing layer, and is more preferably in the range of 40-80% by weight.

In this invention, exposure is conducted on the silver halide emulsion layer applied on the support. Exposure may be performed employing electromagnetic waves. Listed as electromagnetic waves are, for example, light, such as visible light and UV light; and radioactive rays, such as electronic beams, and X-rays, but UV light or near-infrared rays are preferable. Further, a light source which has an appropriate wavelength distribution may be employed for light exposure, however a light source of a narrow wavelength distribution may also be employed for light exposure.

To obtain visible light, employed may be various luminous bodies exhibiting photogenesis in the appropriate spectral regions. For example, employed may be any one of a red luminous body, a green luminous body, or a blue luminous body, or a mixture of at least two of them. The spectral regions are not limited to the above red, green and blue, and also employed may be luminous bodies of yellow, orange or violet, or a fluorescent material producing luminescence in the infrared region. Further, an ultraviolet lamp is also preferable, and g-beams or I-beams of a mercury lamp may also be employed.

Further, in this invention, exposure may be conducted with employment of various laser beams. For example, exposure of this invention is preferably conducted employing a scanning exposure method with a monochromatic high-density beam using a gas laser, a light-emitting diode, a semiconductor laser, a second harmonic generation (SHG) light source combined a nonlinear optical crystal and a semiconductor laser, or a solid-state laser which employs a semiconductor laser as an excitation light source. Further, a KrF excimer laser, an ArF excimer laser, and an F2 laser may also be employed. To keep the system compact and high efficiency, exposure is preferably conducted employing a semiconductor laser, or a second harmonic generation light source (SHG) combined a semiconductor laser or a solid-state laser, and a nonlinear optical crystal. Specifically, to design a compact device featuring high efficiency, longer-life and being highly stable, exposure is preferably conducted employing a semiconductor laser.

Specifically, as a laser light source, preferably cited are an ultraviolet semiconductor laser, a blue semiconductor laser, a green semiconductor laser, a red semiconductor laser, and a near-infrared laser.

An image exposure method on a silver halide grain containing layer may be employed with plane exposure using a photomask, or scanning exposure using laser beams. In this case, exposure may be via a condenser type exposure employing a lens or a reflector type exposure employing a reflecting mirror, and employed may be an exposure method of face-to-face contacting exposure, near-field exposure, reduction-projection exposure, or reflective projection exposure. Since output power from a laser is required to be of a suitable quantity to expose the silver halide, it is acceptable at a level of several μW-5 W.

In the present invention, after exposure on a silver halide emulsion layer, black-and-white photographic processing (hereinafter, referred to simply as photographic processing) is further conducted. The usual photographic processing technique employed for silver halide grain photographic film, printing paper and graphic arts printing film, as well as an emulsion mask for photomasking, may be employed. The developing solution is not particularly limited, but a PQ developing solution, an MQ developing solution, an MAA developing solution and so forth are preferably usable.

In this invention, metallic silver portions, preferably being image producing metallic silver portions, are formed together with light transparent portions, described later, by conducting the above exposure and photographic processing.

The photographic processing in this invention may include fixing process performed in order to remove the silver halide grains in the unexposed portions and stabilize those kinds of grains in the exposed areas. In the fixing process of this invention, the fixing process technique employed for silver halide grain photographic film, printing paper and graphic arts printing film, as well as an emulsion mask for photomasking, are preferred.

The developing solution composition employed for this invention may include hydroquinones as a developing agent, such as hydroquinone, sodium hydroquinone sulfonate, and chlorohydroquinone, and together in combination with these, employed may be a superadditive developing agent, such as pyrazolidones, e.g., 1-phenyl-3-pyrazolidone, 1-phenyl-4,4-dimethyl-3-pyrazolidone, 1-phenyl-4-methyl-4-hydroxymethyl-3-pyrazolidone, and 1-phenyl-4-methyl-3-pyrazolidone; and N-methyl-p-aminophenol sulfate. Further, it is preferable to employ reductone compounds, such as ascorbic acid and D-iso-ascorbic acid, without using hydroquinone.

A sodium sulfite salt or a potassium sulfite salt may be incorporated as a preserving agent, and a sodium carbonate salt or a potassium carbonate salt may be incorporated as a buffering agent, and diethanolamine, or triethanolamine, and diethylamino propanediol may be incorporated as a development accelerator.

The developing solution pH may be adjusted to the range of 9-12 with an alkaline chemical, such as sodium hydroxide or potassium hydroxide. The pH may generally be set in the range of 10±0.5 for storage stability, but it may also be set in the range of 11±0.5 for a rapid processing. Photographic processing may be conducted under the conditions of 20-40° C., for 1-90 seconds. Further, the replenishing rate of the developing solutions or fixing solutions may be set to the range of 5-216 ml per $m^2$, or less than this when using a development accelerator or a sensitizer. As for reduction of the replenishing rate, it is specifically effective that the amount of silver halide grains is reduced based on the sensitization technique of the emulsion, and reduction of the replenishing rate is achieved by reduction of silver halide grains together with the above developing acceleration technique.

The developing solution employed in photographic processing may incorporate a quality improving agent for the purpose to raise image quality. As such a picture quality improving agent, cited for example, is a nitrogen containing heterocyclic compound, such as 1-phenyl-5-mercaptotetrazole and 5-methylbenzotriazole.

Image contrast, after photographic processing in this invention, is not specifically limited, but it preferably exceeds 4.0. If the contrast after photographic processing exceeds 3.0, the electrical conductivity in the conductive metal layer may be increased to maintain higher transparency in the light transparent portion. As a method to maintain a contrast of 3.0 or more, cited is, for example, doping of the foregoing rhodium or iridium ions.

A fixing solution may be incorporated in this invention such as sodium thiosulfate, potassium thiosulfate, or ammonium thiosulfate as a fixing agent. Aluminium sulfate, or chromium sulfate may be employed as a hardening agent at the time of fixing. As a preserving agent of the fixing agent, employed may be sodium sulfite, potassium sulfite, ascorbic acid, and erythorbic acid, which are described in the developing composition, while in addition, citric acid, or oxalic acid may also be employed.

Employed may be as an antifungal agent in the washing water used in the present invention, N-methyl-isothiazole-3-one, N-methyl-isothiazole-5-chloro-3-one, N-methyl-isothiazole-4,5-dichloro-3-one, 2-nitroglycerine-2-bromine-3-hydroxypropanol, 2-methyl-4-chlorophenol, or hydrogen peroxide.

In the present invention, in order to support developed the contact of silver-to-silver formed via the above-described photographic processing to improve conductivity, it is preferable that at least one of a physical development treatment and a plating treatment is conducted. This is a conductivity-increasing treatment conducted by previously supplying a conductive material source, which is not contained in a photosensitive material, from the outside during photographic processing or after processing. The physical development treatment can be conducted by immersing a photosensitive material containing a silver halide emulsion agent having a latent image or a material capable of being at a physical development starting point in a treatment liquid containing a reducing agent, and a silver ion or a silver complex ion. Not only in cases where the physical development starting point is for a latent image nucleus, but also in cases where developed silver is at the physical development starting point, these are to be defined as a physical development treatment, and are preferably usable. In the present invention, various commonly known methods are usable for a plating treatment, and an electrolytic plating and a nonelectrolytic plating can be used singly or in combination. The nonelectrolytic plating has a feature exhibiting no generation of plating unevenness caused by current distribution unevenness. On the one hand, the electrolytic plating has a feature exhibiting high-speed plating, together with formation of a firm metal coated layer and excellent stability of a plating solution. Examples of metals usable for plating include copper, nickel, cobalt, tin, silver, gold, platinum and others such as various alloys, but copper plating is specifically preferable in view of comparatively easy plating treatment as well as easy generation of high conductivity. In addition, the above-described physical development treatment and plating treatment can be conducted at any time during the foregoing photographic processing, before fixing after photographic processing, or after fixing, but they are preferably conducted after fixing in view of maintenance of excellent film transparency. In the present invention, a metal amount added via the physical development treatment or the plating treatment is preferably 10-100 times by weight as large as developed silver obtained via an exposure process and photographic processing of a photosensitive material. This value can be obtained by quantitating metal contained in a photographic material before and after conducting the physical development treatment or the metal-plating treatment by fluorescent X-ray analysis.

When the metal amount added via the physical development treatment or the plating treatment is less than 10 times by weight as large as developed silver obtained via the exposure process and photographic processing of the photosensitive material, conductivity tends to decline easily. When the metal amount added via the physical development treatment or the plating treatment also exceeds 100 times by weight, decline of transmittance caused by metal precipitated into an undesired portion other than a conductive mesh pattern portion tends to occur easily. In addition, in the present invention, both the physical development treatment and the plating treatment are preferably conducted after a black-and-white development treatment.

Next, the conductive metal layer of this invention will be described.

It is preferred that the conductive metal layer of the present invention satisfies at least one of the following conditions;
(1) A void ratio of the conductive metal layer being 0.1-15%,
(2) Glossiness of the conductive metal layer being 50-300%, and
(3) Center line average surface roughness (Ra) of the conductive metal layer being 1-50 nm.

It is more preferred that the conductive metallic portion of the present invention satisfies at least two conditions of the above items, and it is most preferred that it satisfies all three conditions of the above items. In addition, in the case of one condition to be satisfied, it is preferred that a void ratio of the conductive metal layer is 0.1-15%. In the case of two conditions to be satisfied, it is also preferred that a void ratio of the conductive metal layer is 0.1-15%, and glossiness of the conductive metal layer is 50-300%.

The void ratio of (1) is preferably 0.2-10%, and more preferably 0.5-5%. Not only excellent electrical conductivity is obtained by setting compressibility in this range, but also the film toughness can be maintained.

The void ratio is measured and calculated as described below. That is to say, a section is cut out of a prepared conductive metal layer to measure the weight per a unit volume, and calculate specific gravity D of each of the metal layers.

On the other hand, when specific gravities corresponding to each of the components to form conductive metal layers each are designated as $d_1, d_2, \ldots, d_n$, and their weight ratios are also designated as $w_1, w_2, \ldots, w_n$, specific gravity $D_0$ of the conductive metal layer with these components closely-filled is expressed by the following equation.

$$D_0 = (d_1 w_1 + d_2 w_2 + \ldots + d_n w_n)/(w_1 + w_2 + \ldots + w_n)$$

Accordingly, void ratio V % of a conductive metal layer is calculated from the following equation.

$$V = |D - D_0| \times 100/D_0$$

Glossiness of (2) is preferably 100-250%, and more preferably 150-220%. Not only excellent electrical conductivity is obtained by setting glossiness in this range, but also the film toughness can be maintained. In addtion, glossiness can be measured with a conventional glossiness measuring apparatus.

Further, center line average surface roughness (Ra) is preferably 2-30 nm, and more preferably 3-20 nm. Not only excellent electrical conductivity is obtained by setting Ra in this range, but also the film toughness can be maintained. In addtion, center line average surface roughness (Ra) can be measured with a conventional surface roughness measuring instrument.

The above-described items will be satisfied and achieved by appropriately arranging the after-mentioned technical means in combination.

<1> Dispersibility of a metal layer usable to form a conductive metal layer (an emulsion layer containing photosensitive silver halide, a layer containing aliphatic carboxylic acid silver salt or a layer in which Fe—Co alloy is dispersed in a binder) is to be improved. In order to improve dispersibility, a binder exhibiting excellent dispersibility, which contains a polar radical such as a sulfonate group, a phosphate group or a carboxyl group, for example, is used as a binder, a dispersion assistant is used, or a homogenizer such as a sand mill, a kneader or a planetary mixer is employed for effective dispersion.

<2> Calender Treatment is Conducted (Applied Pressure Treatment).

A conductive metal layer is formed by treating a metallic silver portion formed via the foregoing exposure and developing treatment while applying pressure, and subsequently carrying conductive metal particles onto the foregoing metallic silver portion. In the case of applied pressure, employed is surface-to-surface pressure as pressed on a plate with the plate, nip roll pressure applied while passing through an electromagnetic wave shielding material of the present invention between rolls, or pressure applied in combination by which a roll is pressed on a roll. The applied pressure is optionally adjustable in the range of 50-500 kg/cm, but preferably in the range of 100-400 kg/cm, and more preferably 150-350 kg/cm. In the case of an applied pressure of less than 50 kg/cm, the particle-to-particle contact is not effectively obtained, and in the case of an applied pressure exceeding 500 kg/cm, it is not preferred that cracks are generated in a silver-salt-containing layer, and haze is increased.

Heating at a temperature of 40-120° C. is preferable since heating during applied pressure is effective. Heat roll temperature during calendaring is preferably 70-110° C., and more preferably 80-100° C. A compliant roll is usually made of nylon, cotton or metal, but it is preferable to use a metal roll in order to increase compressibility. Heating time is adjusted with the relationship between temperature and calender speed.

The calender speed is usually 5-300 m/min, and higher calender speed is preferable in view of productivity, but the slow speed is desired in order to increase compressibility of a layer as well as the surface quality.

In order to increase the effectiveness of calendering, it is preferable that a thermoplastic material is incorporated into a binder. A polymer having a glass transition temperature (Tg) of from −30° C. to 40° C. may be employed in combination. A single component homopolymer and a multi-component (at least two components) copolymer are usable as such the polymer. Usable examples thereof include vinyl chloride, vinyl chloride vinyl acetate copolymer, vinylidene chloride resin, polyvinyl acetal, polyvinyl butyral, polyester, polyurethane, nitrocellulose, cellulose acetate butyrate, acrylic resin and so forth. A water-soluble polyurethane having a low glass transition temperature is particularly preferable. A layer may also be plasticated by using natural wax such as carnauba wax, chain-extended artificial wax or rosins, fatty acid ester or phosphate ester.

<3> Drying Temperature

In the present invention, a void ratio of the conductive metal layer, glossiness of the surface and center line average surface roughness of the surface are possible to be made within the range of the present invention by conducting a physical development treatment or a plating treatment after black-and-white development treatment. In this case, it is considered that the conductive metal layer is reformed via the physical development treatment or the plating treatment. Specifically, the void ratio of the conductive metal layer, glossiness of the surface and center line average surface roughness of the surface can be made preferably within the range of the present invention by increasing the drying temperature after conducting the physical development treatment or the plating treatment. The drying temperature is at least 50° C., and preferably 53-100° C., and more preferably 55-90° C.

In the application of a light-transmitting electromagnetic wave shielding material, the line width of the above conductive metal layer is preferably at most 20 μm, and a line space of it is preferably at least 50 μm. Further, the conductive metal layer may have a part in which the line width is more than 20

μm for a ground connection. Further, from the viewpoint of not to through images into relief, it is preferable that the line width of the conductive metal layer is less than 18 μm, more preferably less than 15 μm, and still more preferably less than 14 μm, further still more preferably less than 10 μm, and most preferably less than 7 μm.

From the viewpoint of visible light transmittance, the conductive metal layer of this invention preferably exhibits an aperture ratio of at least 85%, more preferably at least 90%, and still more preferably at least 95%. "Aperture ratio" means the ratio of non-line areas where no thin lines form a mesh, compared to the total area of the mesh, and, for example, the aperture ratio of a square, lattice type of mesh of a line width of 10 μm and a pitch of 200 μm is 90%.

"Light transparent portion" in this invention means that portion, which exhibits transparency, other than the conductive metal layer in the transparent electromagnetic wave shielding material. The average visible light transmittance in the light transparent portion is at least 85% which is shown at the minimum transmittance value in the wavelength region of 400-750 nm, except for the light absorption and reflective contribution of the support, is preferably at least 88%, more preferably at least 90%, still more preferably at least 98%, and further is most preferably at least 99%.

The thickness of the support of the transparent electromagnetic wave shielding material in this invention is preferably 5-200 μm, but more preferably 30-150 μm. If the support is in the range of 5-200 μm, the targeted visible light transmittance is easily attained, and handling of it is also easy.

A thickness of a metal mesh formed for a conductive metal layer is desired to be a thickness as thick as possible in order to obtain higher conductivity, but it is preferred that the thickness is to be as thin as possible in order to be viewable at wider angles on a display. The thickness of the present invention is preferably at most 30 μm, more preferably at most 20 μm, still more preferably 0.1-10 μm, but is most preferably 0.01-5 μm.

In this invention, a functional layer may be separately provided, if desired. This functional layer may be of various specifications for each application. For example, for an electromagnetic wave shielding material application for a display, provided may be an anti-reflection layer which functions by adjusting the refractive index and coating thickness; a non-glare coating or an anti-glare coating, both of which exhibit a glare decreasing function; a layer for an image color adjustment function, which absorbs visible light of a specific wavelength; an antifouling layer which functions to easily remove dirt, such as a finger-prints; a scratch-resistant hard coating layer; a layer which serves an impact-absorbing function; and a layer which functions to prevent glass scattering in case of glass breakage. These functional layers may be applied onto the support of the reverse of a silver halide grain containing layer, and may be further applied onto the same surface side.

These functional films may be adhered directly onto the PDP, but may also be adhered onto a transparent base material, such as a glass plate or a plastic plate, separate from the body of a plasma display panel. The functional film may be called an optical filter (or simply a filter).

To minimize reflection of outside light for maximum contrast, an anti-reflection layer having an anti-reflection function may be prepared by a single-layer or a multi-layer laminating method of a vacuum deposition method, a sputtering method, an ion plating method, or an ion beam assist method, in which an inorganic material, such as a metal oxide, a fluoride, a silicide, a boride, a carbide, a nitride, or a sulfide is laminated; or by a single-layer or a multi-layer laminating method, in which employed may be resins exhibiting different refractive indices. Further, a film provided with an anti-reflection treatment may be adhered onto the filter. Further, a film with a non-glare or an anti-glare treatment may be adhered onto the filter. Further, a hard-coat layer may further be adhered, if desired.

The layer with an image color adjustment function, which absorbs visible light of a specific wavelength, is one to correct the emitted light color, and to contain dye absorbing light near 595 nm, because the PDP exhibits a drawback to display a bluish color as a purplish blue, due to the characteristics of the blue emitting fluorescent material which emits a slightly red light. Specific examples of the dyes absorbing the specified wavelengths include well-known inorganic dyes, organic pigments, and inorganic pigments, such as an azo dye, a condensed azo dye, a phthalocyanine dye, an anthlaruinone dye, an indigo dye, a perylene dye, a dioxadine dye, a quinacridone dye, a methane dye, an isoindolinone dye, a quinophthalone dye, a pyrrole dye, a thioindigo dye, and a metal complex dye. Of these, preferred are the phthalocyanine and anthraquinone dyes, due to their excellent weather resistance.

EXAMPLE

The present invention will further be specifically described below referring to examples. In addition, the materials, the added amount, the ratio of those materials, the contents of treatment, and the operating scheme which are shown in the following examples may be appropriately changed, unless it deviates from the spirit of the present invention. Therefore, the extent of the present invention is not to be restrictively interpreted by the examples shown below.

Example 1

An emulsion was prepared containing silver iodobromide grains (at an iodide content of 2.5 mol %) with an average spherical equivalent diameter of 0.044 μm, which contain 100 g of gelatin based on 100 g of silver in the aqueous medium. In this case, the Ag/gelatin weight ratio was brought to 10/1, and the employed gelatin was an alkali-treated low-molecular-weight gelatin of an average molecular weight of 40,000. Further, in this emulsion, potassium bromorhodate and potassium chloroiridate were added to the $10^{-7}$ (mol/molAg) level, and Rh ions and Ir ions were doped onto silver bromide particles. To this emulsion, added was sodium chloropalladate, and after gold-sulfur sensitization, further employing chloroauric acid and sodium thiosulfate, near-infrared sensitization was conducted by addition of a near-infrared sensitization dye at an amount of $10^{-4}$ mol per mol of silver halide (the structures of sensitizing dyes are shown in Table 1). After that, added were a hydrazine or tetrazolium compound as a contrast-increasing agent (the numbers of the specific examples are shown in Table 1), an amine compound or a pyridine compound as an accelerator (again, the numbers of specific examples are shown in Table 1), and an exemplified compound R-1 or R-2 as a redox compound as shown in Table 1. Further, in order to promote silver grain contact during pressing, the emulsion was applied onto polyethylene terephthalate (PET) at a silver coverage of 1 g/m² (being a gelatin coverage of 1 g/m²) together with rosin and carnauba wax to each become 0.1 g/m², and a vinyl sulfone based gelatin hardening agent of 0.1 g/m² (being 0.1 mol per gram of gelatin) Before coating, the PET film was made hydrophilic by corona discharge treatment (being 100 mw/m²) on both sides. Onto one side of the PET, applied were a gelatin layer (at a gelatin coverage of 1 g/m²) and a protective layer (at a gelatin coverage of 1 g/m², as well as one incorporating a silica matting agent at an average particle diameter of 3 μm). The gelatin layer contained an imonium near-infrared absorption dye (at a dye coverage of 0.1 g/m², specific examples shown in Table 1) and an ultraviolet absorption dye (at a dye coverage of 0.1 g/m², specific examples shown in Table 1), both of these were added in the form of solid dispersed particles at an average particle diameter of at most 100 nm. The resulting was then dried to prepare silver halide photosensitive materials of Samples 101-114, as shown in Table 1.

The resulting Samples 101-114 were exposed to near-infrared semiconductor laser light (at a wavelength of 810 nm) to obtain a drawing pattern of developed silver images of a line/space of 5 μm/195 μm, employing an image setter. The samples exposed to near-infrared semiconductor laser light were developed with the following developing solution at 25° C. for 45 seconds, and further, fixing was conducted at 25° C. for 2 minutes employing the following fixing solution, and then rinsed with pure water. Thereafter, a drying process was conducted by using hot air at 50° C. for 3 minutes.

Developing Solution Composition

| | |
|---|---|
| Hydroquinone | 30 g |
| 1-phenyl-3,3-dimethylpyrazolidone | 1.5 g |
| Potassium bromide | 3.0 g |
| Sodium sulfite | 50 g |
| Potassium hydroxide | 30 g |
| Boric acid | 10 g |
| N-n-butyldiethanolamine | 15 g |

Water was added into the above to make 1 liter, and the pH was adjusted to 10.20.

Fixing Solution Composition

| | |
|---|---|
| 72.5% ammonium thiosulfate aqueous solution | 240 ml |
| Sodium sulfite | 17 g |
| Sodium acetate trihydrate | 6.5 g |
| Boric acid | 6.0 g |
| Sodium citrate dehydrate | 2.0 g |
| 90% acetic acid aqueous solution | 13.6 ml |
| 50% sulfuric acid aqueous solution | 4.7 g |
| Aluminium sulfate (being an aqueous solution of converted content to $AL_2O_3$ of 8.1% W/V) | 26.5 g |

Water was added into the above to make 1 liter, and the pH was adjusted to 5.0.

Metal—metal calender treatment was conducted under the calender treatment described in Table 1, employing a metal as a compliant roll after a developing process.

(Preparation of Sample 115)

Sample 115 was prepared similarly to Sample 109 referring to Table 1, except that the Ag/gelatin weight ratio was set to 10 by reducing the amount of utilized gelatin in preparation of above-described Sample 109.

(Preparation of Sample 116)

Sample 116 was prepared similarly to Sample 109, except that the Ag/gelatin weight ratio was set to 50 by reducing the amount of utilized gelatin in preparation of above-described Sample 109.

(Preparation of Sample 117)

Sample 117 was prepared similarly to Sample 109, except that the Ag/gelatin weight ratio was set to 100 by reducing the amount of utilized gelatin in preparation of above-described Sample 109.

(Preparation of Sample 118)

Sample 118 was prepared similarly to Sample 109, except that 50% by weight of the gelatin amount was replaced by water-soluble polyurethane (Tg=20° C.) in preparation of above-described Sample 109.

(Preparation of Sample 119)

Sample 119 was prepared similarly to Sample 109, except that 50% by weight of the gelatin amount was replaced by water-soluble polyurethane (Tg=0° C.) in preparation of above-described Sample 109.

(Preparation of Sample 120)

Sample 120 was prepared similarly to Sample 109, except that 50% by weight of the gelatin amount was replaced by water-soluble polyurethane (Tg=−20° C.) in preparation of above-described Sample 109.

The line width and the surface resistance value of the conductive metal layer in a sample having the conductive metal layer and the light transparent portion were measured. The surface resistance value was measured employing Digital Multimeter 7541 manufactured by Yokogawa Electric Corp. In the present invention, since the mesh of metal wires was protected by the protective layer, the resistance value was determined by measurement through this overcoat. Measurement of the resistance value was conducted in a room at 23° C. and 50% RH. Incidentally, the surface resistance is preferably at most 10 Ω/sq., more preferably at most 2Ω/sq., and still more preferably at most 0.2 Ω/sq.

An infrared absorption spectrometer (Shimadzu FTIR-8300) was employed for near-infrared absorption measurement to measure a near-infrared shielding property in the wavelength region of 800-1000 nm.

A void ratio was measured and calculated by the foregoing method. Glossiness was measured in accordance with JIS-Z-8741 by setting specular glossiness of a glass surface having a refractive index of 1.567 at an incident angle of 45° to 100%.

Surface roughness (Ra) of a conductive metal layer was measured with a cut-off value of 0.08 mm, employing a stylus type surface roughness meter (Surfcom 800A, manufactured by Tokyo Seimitsu Co., Ltd.) in accordance with JIS-B0601.

Contents of the resulting samples are shown in Table 1, and evaluated performance results are also shown in Table 2. Regarding Samples 115-117, a line width and a thickness of a thin matellic line consisting a mesh were 10 μm and 6.2 μm, respectively. Incidentally, as an informative matter, it is to be understood that the present invention exhibits sufficient near-infrared absorption capability with no malfunction of operation devices via measurement of the near-infrared absorption capability.

TABLE 1

| Sample No. | Silver halide grain preparation | | | | Dye preparation | | Conditions of calender treatment | | | |
|---|---|---|---|---|---|---|---|---|---|---|
| | Sensitizing dye | Contrast-increasing agent | Accelerator | Redox compound | *1 | *2 | Applied pressure (kg/cm) | Temperature (° C.) | Speed (m/min) | Nip number |
| 101 | (S-11) | (H-1) | (A-10) | (R-1) | (IR-1) | (UV-1) | 40 | 50 | 20 | 2 |
| 102 | (S-11) | (H-1) | (A-11) | (R-1) | (IR-1) | (UV-1) | 100 | 80 | 20 | 4 |

TABLE 1-continued

| | Silver halide grain preparation | | | Dye preparation | | Conditions of calender treatment | | | |
|---|---|---|---|---|---|---|---|---|---|
| Sample No. | Sensitizing dye | Contrast-increasing agent | Accelerator | Redox compound | *1 | *2 | Applied pressure (kg/cm) | Temperature (°C.) | Speed (m/min) | Nip number |
| 103 | (S-11) | (H-2) | (A-12) | (R-1) | (IR-2) | (UV-2) | 200 | 90 | 20 | 6 |
| 104 | (S-11) | (H-1) | (A-13) | (R-1) | (IR-3) | (UV-3) | 300 | 100 | 20 | 6 |
| 105 | (S-11) | (H-2) | (A-14) | (R-1) | (IR-4) | (UV-4) | 400 | 100 | 20 | 6 |
| 106 | (S-11) | (H-1) | (A-15) | (R-1) | (IR-5) | (UV-5) | 400 | 100 | 20 | 8 |
| 107 | (S-11) | (T-1) | (A-10) | (R-2) | (IR-1) | (UV-1) | 350 | 90 | 20 | 2 |
| 108 | (S-11) | (T-1) | (A-11) | (R-2) | (IR-2) | (UV-1) | 350 | 90 | 20 | 4 |
| 109 | (S-11) | (T-1) | (A-12) | (R-2) | (IR-3) | (UV-2) | 350 | 90 | 20 | 6 |
| 110 | (S-11) | (T-1) | (A-13) | (R-2) | (IR-4) | (UV-3) | 350 | 90 | 20 | 8 |
| 111 | (S-11) | (T-1) | (A-14) | (R-2) | (IR-1) | (UV-4) | 350 | 90 | 10 | 6 |
| 112 | (S-11) | (T-1) | (A-15) | (R-2) | (IR-2) | (UV-1) | 350 | 90 | 40 | 6 |
| 113 | (S-11) | (T-1) | (A-11) | (R-2) | (IR-3) | (UV-2) | 350 | 90 | 70 | 6 |
| 114 | (S-11) | (T-1) | (A-12) | (R-2) | (IR-4) | (UV-3) | 350 | 90 | 100 | 6 |

*1: Infrared absorption dye,
*2: Ultraviolet absorption dye

TABLE 2

| | Performance results | | | | | | |
|---|---|---|---|---|---|---|---|
| Sample No. | Surface resistance ($\Omega$/sq.) | Visible light transmittance (%) | Near-infrared absorption (80% to be cut off) | Void ratio (%) | Glossiness (%) | Center line average surface roughness (Ra) (nm) | Remarks |
| 101 | 80.00 | 87 | 80 | 20 | 38 | 65 | Comp. |
| 102 | 8 | 87 | 80 | 12 | 112 | 42 | Inv. |
| 103 | 0.08 | 88 | 80 | 8 | 137 | 26 | Inv. |
| 104 | 0.06 | 89 | 80 | 5 | 165 | 18 | Inv. |
| 105 | 0.03 | 90 | 80 | 3 | 204 | 9 | Inv. |
| 106 | 0.02 | 91 | 80 | 2 | 217 | 5 | Inv. |
| 107 | 3 | 88 | 80 | 11 | 120 | 39 | Inv. |
| 108 | 0.07 | 88 | 80 | 9 | 141 | 29 | Inv. |
| 109 | 0.04 | 88 | 80 | 4 | 199 | 11 | Inv. |
| 110 | 0.03 | 88 | 80 | 3 | 203 | 8 | Inv. |
| 111 | 0.03 | 88 | 80 | 3 | 205 | 8 | Inv. |
| 112 | 0.06 | 88 | 80 | 5 | 168 | 16 | Inv. |
| 113 | 0.07 | 88 | 80 | 7 | 148 | 27 | Inv. |
| 114 | 1.5 | 88 | 80 | 10 | 129 | 34 | Inv. |
| 115 | 0.03 | 88 | 80 | 4 | 205 | 11 | Inv. |
| 116 | 0.02 | 88 | 80 | 4 | 214 | 11 | Inv. |
| 117 | 0.01 | 88 | 80 | 5 | 219 | 12 | Inv. |
| 118 | 0.03 | 88 | 80 | 3 | 208 | 8 | Inv. |
| 119 | 0.02 | 88 | 80 | 2 | 213 | 6 | Inv. |
| 120 | 0.01 | 88 | 80 | 1 | 220 | 4 | Inv. |

Comp.: Comparative,
Inv.: Present invention

As is clear from Table 2, it is to be understood that the electromagnetic wave shielding material of the present invention exhibits excellent conductivity, whereby an electromagnetic wave shielding property can be improved.

Example 2

The Ag/gelatin weight ratio was set to 2 by reducing the amount of utilized gelatin employing the constitution of Sample 109 of silver halide photosensitive material in Example 1, the near-infrared sensitizing dye was replaced by the following SD-1, and neither a layer containing a near-infrared absorption dye and a UV absorption dye on the side opposite the silver halide emulsion layer, nor a protective layer was provided to prepare Sample 200 of silver halide photosensitive material.

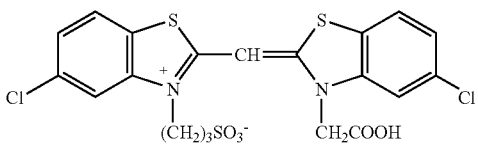

SD-1

After mesh exposure was conducted so as to be in the lattice-like form of a line width of 10 μm and a line space of 240 μm to Sample 200 of silver halide photosensitive material, employing laser light with an emission wavelength of 440 nm (blue laser diode, produced by Nichia Corporation) to conduct photographic processing at 25° C. for 60 seconds using the following black-and-white developer, a fixing treatment was conducted at 25° C. for 120 seconds employing the following fixer to subsequently conduct a washing treatment. Copper plating was further carried out at 25° C. and 3 A/cm² for 2 minutes to subsequently conduct another washing treatment. Prepared was each sample in which only black-and-white photographic processing was conducted, a physical development treatment was conducted after the black-and-white photographic processing, the physical development treatment and a plating treatment were conducted after the black-and-white photographic processing, or the plating treatment was conducted after the black-and-white photographic processing. After completing the final washing treatment for each sample, each of samples was dried in a hot air circulating box for 3 minutes. The drying temperature was changed depending on the sample to investigate the dependency. A calender treatment with a speed of 20 m/min and the utilized nip number of 4 was carried out to each sample after drying, in the same manner as in Example 1. The resulting samples 201-216 are shown in Table 3.

(Black-and-White Developer)

| Pure water | 500 ml |
|---|---|
| Metol | 2 g |
| Anhydrous sodium sulfite | 80 g |
| Hydroquinone | 4 g |
| Borax | 4 g |
| Sodium thiosulfate | 10 g |
| Potassium bromide | 0.5 g |

Water was added into the above to make 1 liter.

(Fixer)

| Pure water | 750 ml |
|---|---|
| Sodium thiosulfate | 250 g |
| Anhydrous sodium sulfite | 15 g |
| Glacial acetic acid | 15 ml |
| Aluminum potassium sulfate | 15 g |

Water was added into the above to make 1 liter.

(Physical Developer)

| Pure water | 800 ml |
|---|---|
| Citrate | 5 g |
| Hydroquinone | 7 g |
| Silver nitrate | 3 g |

Water was added into the above to make 1 liter.

(Electrolytic Plating Solution)

| Copper sulfate (pentahydrate) | 180 g |
|---|---|
| Concentrated sulfuric acid | 50 g |
| Sodium Chloride | 70 mg |

Water was added into the above to make 1 liter.

TABLE 3

| Sample No. | Black-and-white photographic processing (conducted or not conducted) | Physical development treatment (conducted or not conducted) | Copper plating treatment (conducted or not conducted) | Drying temperature (° C.) | Applied pressure (kg/cm) | Temperature during application of pressure (° C.) |
|---|---|---|---|---|---|---|
| 201 | Conducted | Not conducted | Not conducted | 50 | 0 | *1 |
| 202 | Conducted | Not conducted | Not conducted | 50 | 350 | *1 |
| 203 | Conducted | Not conducted | Not conducted | 50 | 350 | 80 |
| 204 | Conducted | Not conducted | Not conducted | 80 | 0 | *1 |
| 205 | Conducted | Conducted | Not conducted | 50 | 0 | *1 |
| 206 | Conducted | Conducted | Not conducted | 55 | 0 | *1 |
| 207 | Conducted | Conducted | Not conducted | 70 | 0 | *1 |
| 208 | Conducted | Conducted | Not conducted | 50 | 150 | *1 |
| 209 | Conducted | Conducted | Conducted | 50 | 0 | *1 |
| 210 | Conducted | Conducted | Conducted | 53 | 0 | *1 |
| 211 | Conducted | Conducted | Conducted | 70 | 0 | *1 |
| 212 | Conducted | Conducted | Conducted | 50 | 150 | *1 |
| 213 | Conducted | Not conducted | Conducted | 50 | 0 | *1 |
| 214 | Conducted | Not conducted | Conducted | 55 | 0 | *1 |
| 215 | Conducted | Not conducted | Conducted | 70 | 0 | *1 |
| 216 | Conducted | Not conducted | Conducted | 50 | 150 | *1 |

*1: Room temperature

The results of the resulting samples 201-216 evaluated in the same manner as in Example 1 are shown in Table 4.

TABLE 4

| Sample No. | Surface resistance (Ω/sq.) | Visible light transmittance (%) | Void ratio (%) | Glossiness (%) | Center line average surface roughness (Ra) (nm) | Remarks |
|---|---|---|---|---|---|---|
| 201 | 90.00 | 88 | 25 | 40 | 78 | Comp. |
| 202 | 8.40 | 88 | 11 | 113 | 46 | Inv. |

TABLE 4-continued

| Sample No. | Surface resistance (Ω/sq.) | Visible light trans- mittance (%) | Void ratio (%) | Gloss- iness (%) | Center line average surface roughness (Ra) (nm) | Remarks |
|---|---|---|---|---|---|---|
| 203 | 0.22 | 89 | 9 | 124 | 32 | Inv. |
| 204 | 9.90 | 88 | 15 | 47 | 65 | Inv. |
| 205 | 13.00 | 87 | 19 | 43 | 71 | Comp. |
| 206 | 9.60 | 87 | 12 | 56 | 67 | Inv. |
| 207 | 2.40 | 87 | 10 | 89 | 58 | Inv. |
| 208 | 0.17 | 89 | 6 | 142 | 29 | Inv. |
| 209 | 0.10 | 83 | 16 | 47 | 68 | Comp. |
| 210 | 0.07 | 85 | 11 | 64 | 53 | Inv. |
| 211 | 0.05 | 86 | 9 | 92 | 41 | Inv. |
| 212 | 0.03 | 87 | 5 | 188 | 29 | Inv. |
| 213 | 0.41 | 86 | 17 | 46 | 69 | Comp. |
| 214 | 0.15 | 86 | 11 | 58 | 57 | Inv. |
| 215 | 0.09 | 87 | 9 | 90 | 45 | Inv. |
| 216 | 0.04 | 88 | 6 | 174 | 29 | Inv. |

Comp.: Comparative,
Inv.: Present invention

As is clear from Table 4, it is to be understood that the electromagnetic wave shielding material of the present invention exhibits excellent conductivity even though it is subjected to a physical development treatment and a plating treatment followed by black-and-white photographic processing.

Example 3

The electromagnetic wave shielding material of the present invention prepared in Example 1 and Example 2 was placed on a plasma display panel front plane as a plasma display panel electromagnetic wave shielding material to see whether the effect was produced. As a result, it was confirmed that any of electromagnetic wave shielding materials for the plasma display panel exhibited excellent electromagnetic wave shielding capability.

EFFECT OF THE INVENTION

The present invention is to provide an electromagnetic wave shielding material exhibiting an excellent electromagnetic wave shielding property, and also to provide a manufacturing method with quick and simple processing, in which a thin-line-state picture image can easily be formed. An electromagnetic wave shielding material exhibiting an excellent near-infrared shielding property can further be provided if desired.

What is claimed is:

1. An electromagnetic wave shielding material comprising a support and provided thereon, a conductive metal layer, wherein the conductive metal layer satisfies all of the following conditions:
   (1) a void ratio of the conductive metal layer is 0.1-15%,
   (2) Glossiness of the conductive metal layer is 50-300%, and
   (3) Center line average surface roughness (Ra) of the conductive metal layer is 1-50 nm.
2. The electromagnetic wave shielding material of claim 1, wherein the conductive metal layer comprises silver.
3. The electromagnetic wave shielding material of claim 1, further comprising a near-infrared absorption layer provided on the support.
4. The electromagnetic wave shielding material of claim 3, wherein the near-infrared absorption layer is provided between the support and the conductive metal layer, or on a side of the support opposite the conductive metal layer.
5. The electromagnetic wave shielding material of claim 1, wherein the conductive metal layer has a surface resistance of at most 10 Omega/sq.
6. The electromagnetic wave shielding material of claim 1, wherein the conductive metal layer has a surface resistance of at most 2 Omega/sq.
7. The electromagnetic wave shielding material of claim 1, comprising the support and provided thereon a conductive metal mesh having a line width of at most 20 mm, a line space of at least 50 mm, a thickness of at most 20 mm and an aperture ratio of at least 85%.
8. A method of manufacturing the electromagnetic wave shielding material of claim 1, comprising the steps of:
   exposing a silver halide photosensitive material to light; and
   developing the exposed silver halide photosensitive material via photographic processing.
9. The method of manufacturing the electromagnetic wave shielding material of claim 1, comprising the steps of:
   exposing a silver halide photosensitive material to light;
   developing the exposed silver halide photosensitive material via photographic processing; and
   subsequently conducting an applied pressure treatment to the developed silver halide photosensitive material.
10. The method of claim 9,
    wherein the applied pressure treatment is a calender treatment conducted at 50-500 kg.
11. The method of claim 8, comprising the steps of:
    exposing the silver halide photosensitive material to light;
    developing the exposed silver halide photosensitive material via photographic processing; and
    subsequently conducting at least one of a physical development treatment and a plating treatment to the developed silver halide photosensitive material.
12. The method of claim 9, comprising the steps of:
    exposing a silver halide photosensitive material to light;
    developing the exposed silver halide photosensitive material via photographic processing;
    subsequently conducting at least one of a physical development treatment and a plating treatment to the developed silver halide photosensitive material; and
    conducting the applied pressure treatment to the silver halide photosensitive material.
13. The method of claim 11, further comprising the step of:
    conducting a drying process at a temperature of 53-100° C., after conducting at least one of the physical development treatment and the plating treatment.
14. The method of claim 12, further comprising the step of:
    conducting a drying process at a temperature of 53-100° C., after conducting at least one of the physical development treatment and the plating treatment.
15. The electromagnetic wave shielding material of claim 1, comprising an electromagnetic wave shielding material for a plasma display panel.

* * * * *